(12) United States Patent
Olson et al.

(10) Patent No.: US 10,126,177 B2
(45) Date of Patent: Nov. 13, 2018

(54) SEMICONDUCTOR DEVICE BURN-IN TEMPERATURE SENSING

(71) Applicant: Micro Control Company, Fridley, MN (US)

(72) Inventors: Donald Robert Olson, Mounds View, MN (US); Daniel Aaron Haapala, Maple Grove, MN (US)

(73) Assignee: Micro Control Company, Fridley, MN (US)

( * ) Notice: Subject to any disclaimer, the term of this patent is extended or adjusted under 35 U.S.C. 154(b) by 227 days.

(21) Appl. No.: 15/117,676

(22) PCT Filed: Feb. 5, 2015

(86) PCT No.: PCT/US2015/014562
§ 371 (c)(1),
(2) Date: Aug. 9, 2016

(87) PCT Pub. No.: WO2015/123078
PCT Pub. Date: Aug. 20, 2015

(65) Prior Publication Data
US 2016/0349118 A1     Dec. 1, 2016

Related U.S. Application Data

(60) Provisional application No. 61/939,846, filed on Feb. 14, 2014.

(51) Int. Cl.
*G01K 7/01*      (2006.01)
*G01R 31/28*    (2006.01)

(52) U.S. Cl.
CPC ............... *G01K 7/01* (2013.01); *G01K 7/015* (2013.01); *G01R 31/2874* (2013.01)

(58) Field of Classification Search
CPC ...... G01K 7/01; G01K 7/015; G01R 31/2874; G01R 31/2872; G01R 31/2855; G01R 31/318577; G01R 31/2817
See application file for complete search history.

(56) References Cited

U.S. PATENT DOCUMENTS

| | | |
|---|---|---|
| 5,195,827 A | 3/1993 | Audy et al. |
| 5,359,285 A | 10/1994 | Hashinaga et al. |
| | (Continued) | |

FOREIGN PATENT DOCUMENTS

| | | |
|---|---|---|
| TW | 201428247 | 7/2014 |
| TW | 201501099 | 1/2015 |
| WO | 2015123078 A1 | 8/2015 |

OTHER PUBLICATIONS

International Search Report and Written Opinion of PCT/US2015/014562, dated Apr. 23, 2015.

(Continued)

*Primary Examiner* — Lisa Caputo
*Assistant Examiner* — Philip Cotey
(74) *Attorney, Agent, or Firm* — Brian D. Kaul; Westman, Champlin & Koehler, P.A.

(57) ABSTRACT

A remote diode temperature sensing circuit for use in a burn-in system to sense a temperature of a semiconductor device under test includes a temperature sense circuit and an adapter circuit. The temperature sense circuit is configured to output temperature sense currents ($I_s$) during a temperature sense routine. The adapter circuit is configured to drive mirrored sense currents ($I_{ms}$), which mirror the temperature sense currents, through a diode of the semiconductor device that is connected to an input/output package pin, and present voltage differences across the diode responsive to the mirrored sense currents to the temperature sense circuit. The temperature sense circuit is configured to discharge a tem- (Continued)

perature output signal that is indicative of the temperature of the diode based on the voltage differences.

16 Claims, 5 Drawing Sheets

(56) References Cited

U.S. PATENT DOCUMENTS

| | | | |
|---|---|---|---|
| 5,582,235 A | 12/1996 | Hamilton et al. | |
| 6,169,442 B1* | 1/2001 | Meehan | G01K 7/01 327/307 |
| 6,332,710 B1* | 12/2001 | Aslan | G01K 1/026 327/512 |
| 6,554,469 B1 | 4/2003 | Thomson et al. | |
| 7,150,561 B1 | 12/2006 | D' Aquino et al. | |
| 7,252,432 B1* | 8/2007 | Henderson | G01K 1/026 327/513 |
| 7,461,974 B1 | 12/2008 | Aslan et al. | |
| 7,826,998 B1 | 11/2010 | Taheri et al. | |
| 2005/0036352 A1* | 2/2005 | Norris | G01R 31/2868 365/123 |
| 2006/0049843 A1* | 3/2006 | Jenkins | G01R 31/286 324/750.03 |
| 2006/0063285 A1 | 3/2006 | Miller | |
| 2006/0265174 A1* | 11/2006 | Doyle | G01K 1/026 702/130 |

OTHER PUBLICATIONS

ADT7461 ±1° C. Temperature Monitor with Series Resistance Cancellation, May 2012—Rev. 7 © Semiconductor Components Industries, LLC, http://onsemi.com, 20 pages.

Hughes, Ronnie D., "Remote Diodes yield accurate temperature measurements," Jul. 10, 2003, www.edn.com, pp. 59-62.

±1° C. Temperature Sensor with Series-R, η-Factor, and Automatic Beta Compensation, Texas Instruments Incorporated, Copyright © 2009-2013, 42 pages.

English translation of Office Action including a Search Report for Taiwan Patent Application No. 104104589, dated Jun. 27, 2018.

* cited by examiner

SEMICONDUCTOR DEVICE BURN-IN TEMPERATURE SENSING

CROSS-REFERENCE TO RELATED APPLICATION

This Application is a Section 371 National Stage Application of International Application No. PCT/US2015/014562, filed Feb. 5, 2015 and published as WO 2015/123078 A1 on Aug. 20, 2015, in English, which claims the benefit of U.S. Provisional Application No. 61/939,846, filed Feb. 14, 2014, the contents of which are hereby incorporated by reference in their entirety.

BACKGROUND

Semiconductor devices, such as silicon integrated circuit chips or other semiconductor devices, are subject to early failure during their life cycle. It is desirable to detect and eliminate the devices that are most prone to early failure prior to sending them to market. Additionally, it is desirable to identify the components of the semiconductor devices that cause the early failures so that they may be improved. Thus, producers of these devices have found it cost-effective to utilize burn-in systems to rigorously temperature stress the semiconductor devices while simultaneously powering them in order to test the reliability of the devices.

Burn-in test systems typically utilize burn-in boards to support a number of semiconductor devices to be tested. The burn-in test system powers the devices under test and exposes the devices to heat stress over an extended period of time. A determination of the reliability of the devices can be made based on the actual semiconductor die temperature during the test.

One option used by semiconductor manufacturers to detect the temperature of a device under test, is to incorporate a diode within the semiconductor device that is dedicated to temperature sensing. The dedicated temperature sense diode is accessed through two package pins, such as described in U.S. Pat. No. 5,359,285. Conventional techniques are used to establish the temperature of the device under test using the dedicated diode. In general, multiple currents are delivered to the dedicated temperature sense diode through the corresponding pins of the device. An accurate temperature reading can then be obtained for the device based on the applied currents and the voltage across the diode during application of the currents. One such conventional technique is described in U.S. Pat. No. 5,195,827.

The package pins dedicated to temperature sensing during burn-in testing generally serve no purpose after the burn-in testing is completed, as they are not input/output (I/O) pins, or pins that are connected to the core logic of the device. The benefit from the increase in cost, size and complexity of the semiconductor device due to the inclusion of the dedicated temperature sensing package pins and the temperature sense diode, is lost following burn-in testing. The added cost of including the dedicated temperature sensing package pins can be significant when the dedicated temperature sensing package pins constitute a relatively large percentage of the total available pins. As a result, some manufacturers are reluctant to include dedicated temperature sensing package pins in some semiconductor devices.

When the semiconductor devices do not include dedicated temperature sensing package pins, the temperature of the semiconductor device is estimated based on the temperature of the top of the package, which is detected by a temperature sensor that is external to the semiconductor device. However, the estimated package temperature can be inaccurate if the package-to-die thermal resistance is high and the semiconductor dissipates a large amount of power. Unfortunately, the power usage and thermal resistance values are generally not known at the burn-in testing stage of development.

SUMMARY

Embodiments of the invention are directed to circuits and methods for providing a direct temperature measurement of a semiconductor device during burn-in testing. Some embodiments are directed to a remote diode temperature sensing circuit for use in a burn-in system to sense a temperature of a semiconductor device under test that includes a diode connected to an input/output (I/O) package pin. In some embodiments, the remote diode temperature sensing circuit includes a temperature sense circuit and an adapter circuit. The temperature sense circuit is configured to output temperature sense currents ($I_s$) during a temperature sense routine. The adapter circuit is configured to drive mirrored sense currents ($I_{ms}$), which mirror the temperature sense currents, through the diode and present voltage differences across the diode responsive to the mirrored sense currents to the temperature sense circuit. The temperature sense circuit is configured to discharge a temperature output signal that is indicative of the temperature of the diode based on the voltage differences.

Some embodiments are directed to an adapter circuit for use in a burn-in system for translating a temperature sense routine of a temperature sense circuit for application to a diode of a semiconductor device under test that is connected to an input/output (I/O) package pin. In some embodiments, the adapter circuit includes a current measurement block, a forced current block, a voltage measurement block, and a force voltage block. The current measurement block is configured to measure temperature sense currents ($I_s$) output from the temperature sense circuit. The forced current block is configured to drive mirrored sense currents ($I_{ms}$), which mirror the temperature sense currents, through the diode. The voltage measurement block is configured to measure voltage differences across the diode during the driving of the mirrored sense currents through the diode. The force voltage block is configured to present the measured voltage differences to the temperature sense circuit. The temperature sense current produces a temperature output signal based on the voltage differences.

Some embodiments are directed to a method of sensing, measuring, or estimating a temperature of a diode of a semiconductor device during burn-in testing. In the method, power is applied to the semiconductor device and functional tests of the core logic of the semiconductor device are performed through I/O pins. A temperature sense circuit generates temperature sense currents. Mirrored sense currents, which mirror the sense currents, are driven through the diode. The voltage differences that are produced across the diode in response to driving the mirrored sense currents $I_{ms}$ through the diode are measured. The measured voltages are presented to the temperature sense circuit. An output signal, which is indicative of a temperature of the diode, is generated by the temperature sense circuit based on the voltage differences.

This Summary is provided to introduce a selection of concepts in a simplified form that are further described below in the Detailed Description. This Summary is not intended to identify key features or essential features of the

DETAILED DESCRIPTION OF ILLUSTRATIVE EMBODIMENTS

Figure 1:
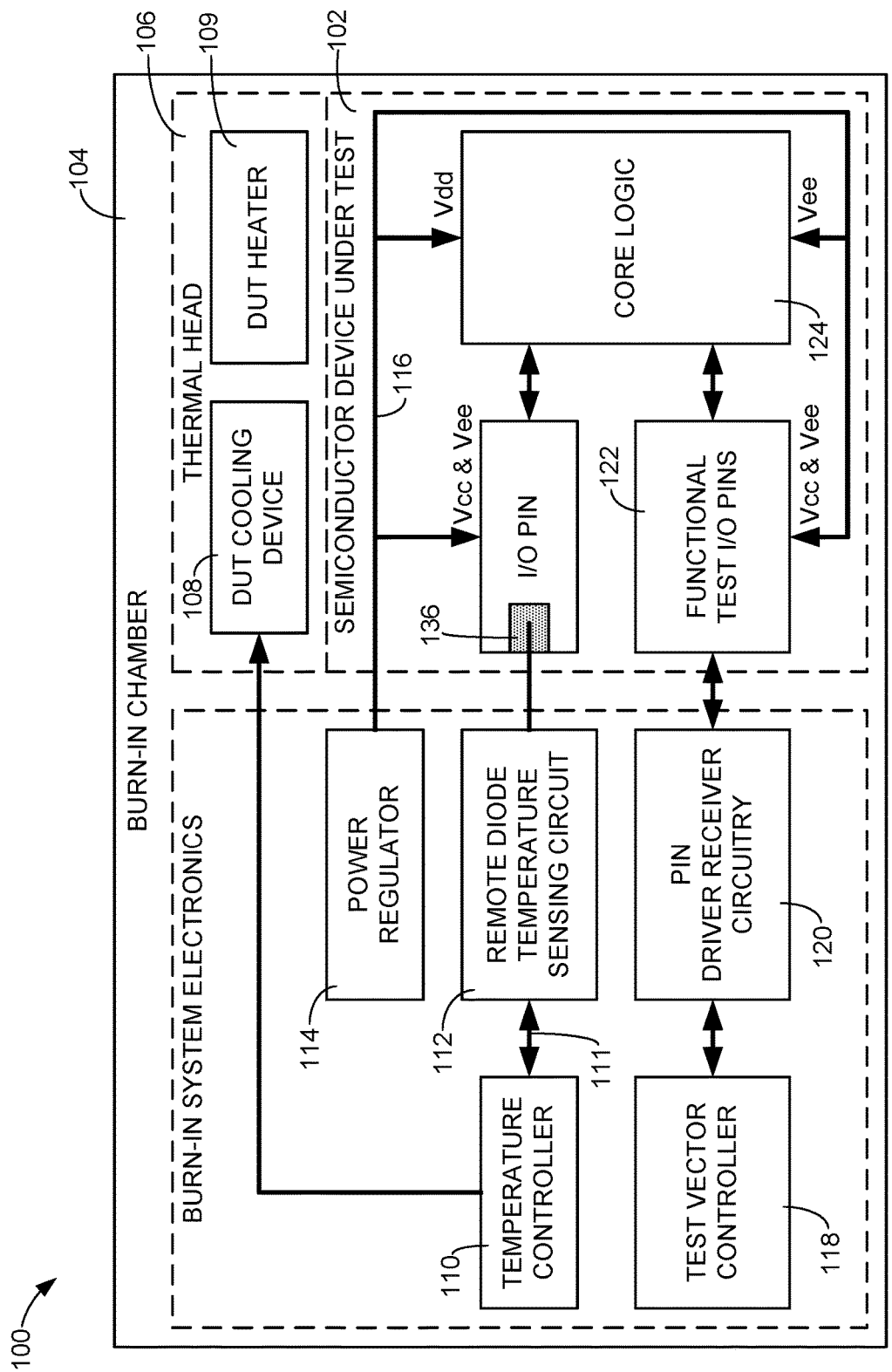
FIG. 1 is a simplified block diagram of an exemplary burn-in test system, in accordance with embodiments of the invention.

Embodiments of the invention are described more fully hereinafter with reference to the accompanying drawings. Elements that are identified using the same or similar reference characters refer to the same or similar elements. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Specific details are given in the following description to provide a thorough understanding of the embodiments. However, it is understood by those of ordinary skill in the art that the embodiments may be practiced without these specific details. For example, circuits, systems, networks, processes, frames, supports, connectors, motors, processors, and other components may not be shown, or shown in block diagram form in order to not obscure the embodiments in unnecessary detail.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will further be appreciated by one of skill in the art, the present invention may be embodied as methods, systems, and/or computer program products. Accordingly, the present invention may take the form of an entirely hardware embodiment, an entirely software embodiment or an embodiment combining software and hardware aspects. Furthermore, the present invention may take the form of a computer program product on a computer-usable storage medium having computer-usable program code embodied in the medium. Any suitable computer readable medium may be utilized including hard disks, CD-ROMs, optical storage devices, or magnetic storage devices. Such computer readable media and memory for computer programs and software do not include transitory waves or signals.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the invention may also be described using flowchart illustrations and block diagrams. Although a flowchart may describe the operations as a sequential process, many of the operations can be performed in parallel or concurrently. In addition, the order of the operations may be re-arranged. A process is terminated when its operations are completed, but could have additional steps not included in a figure or described herein.

It is understood that one or more of the blocks (of the flowcharts and block diagrams) may be implemented by computer program instructions. These program instructions may be provided to a processor circuit, such as a microprocessor, microcontroller or other processor, which executes the instructions to implement the functions specified in the block or blocks through a series of operational steps to be performed by the processor(s) and corresponding hardware components.

FIG. 1 is a simplified block diagram of an exemplary burn-in test system 100, in accordance with embodiments of the invention. Many of the depicted elements are conventional and, thus, a detailed explanation of each element is unnecessary. In general, the system 100 may utilize one or more burn-in boards (not shown) having sockets for supporting a number of semiconductor devices 102 for testing in a chamber 104 of a burn-in oven, for example. Thus, while only a single device 102 is depicted in FIG. 1, it is understood that embodiments of the invention are applicable to systems that are configured to test multiple devices 102.

The burn-in system 100 is configured to power and expose the devices 102 under test to heat stress the devices 102 over an extended period of time. In some embodiments, the system 100 includes a heat exchange system 106 that is used to maintain the devices 102 within a desired temperature range to prevent overheating the devices 102, which can damage properly functioning semiconductor devices 102. In some embodiments, the heat exchange system 106 includes a cooling device 108 and/or a heating device 109. A temperature controller 110 may be used to control the heat exchange system 106 to maintain the devices 102 within the desired temperature range in response to a temperature output signal 111 from a remote diode temperature sensing circuit 112 formed in accordance with one or more embodiments described below.

The burn-in system 100 may also include one or more power stages that include one or more power regulators 114 that are used to supply a desired power 116 to a testing stage of the burn-in board or system 100. The testing stage handles the application of the power 116 supplied from the power regulators 114 to the semiconductor devices 102. Thus, the power regulators 114 may supply desired voltages to the device 102 under test through conventional power pins (i.e., not I/O pins), such as a positive supply voltage Vcc, a negative supply voltage Vee (e.g., ground), a logic positive supply voltage Vdd, or other voltage, for example.

The system 100 includes electronics, such as a test vector controller 118 and a pin driver receiver circuitry 120, that are used to perform various functional tests on the device 102 through a set of functional test I/O pins 122. The functional tests determine whether components of the semiconductor device 102, such as core logic 124 or other components, are operating properly during the testing period.

Figure 2:
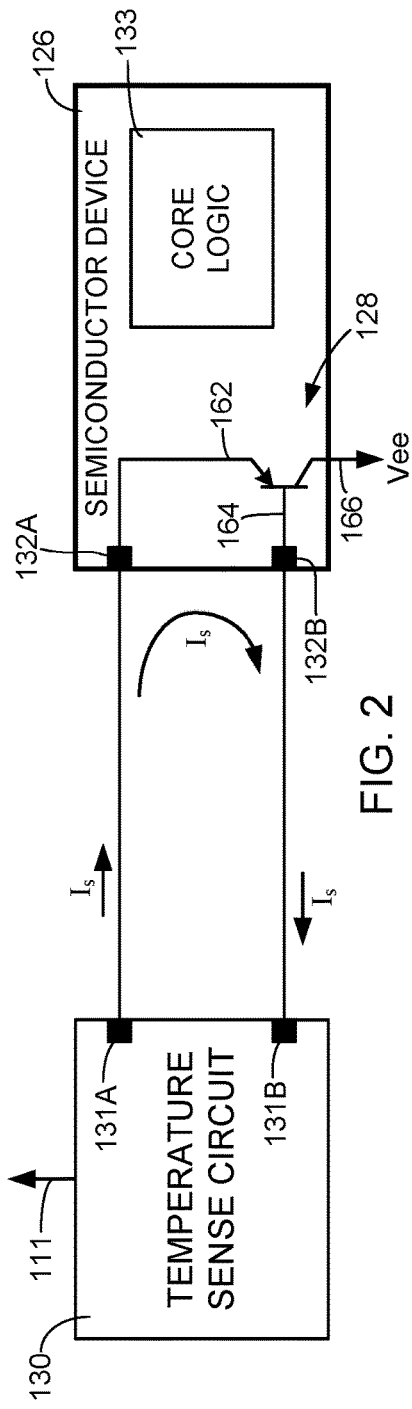
FIG. 2 is a simplified diagram illustrating a dedicated temperature sense diode of a semiconductor device and a remote diode temperature sense circuit configured to measure or estimate a temperature of the temperature sense diode during burn-in testing, in accordance with the prior art.

As mentioned above, some semiconductor devices 126 of the prior art include a dedicated temperature sense diode 128, such as that formed using a p-n junction transistor, that is solely used to measure the die temperature of the device 126 during burn-in testing, as shown in the simplified diagram of FIG. 2. Burn-in systems of the prior art utilize a conventional remote diode temperature sense circuit 130 to sense the temperature of the diode 128, which is indicative of the die temperature of the semiconductor device 126.

The circuit 130 includes non-I/O pins 131A and 131B, which are coupled to dedicated temperature sensing pins 132A and 132B of the semiconductor device 126, and are not coupled to core logic 133 of the device 126. Package pins of the semiconductor device 126 that are coupled to the core logic 133 are not shown in order to simplify the drawing. The circuit 130 delivers temperature sense currents $I_s$ through the diode 128 and measures a voltage difference between the pins 131A and 131B or pins 132A and 132B during delivery of the sense currents $I_s$, in accordance with conventional remote diode temperature sensing techniques. The measured voltage difference is used to determine the temperature of the diode 128 and provide an estimate of the die temperature of the device 126. The sensed temperature of the diode 128 may be output from the circuit 130 as a temperature signal 111, which may be used by a temperature controller to control a heat exchange system to maintain the device 126 within a desired temperature range. The pins 132A and 132B, as well as the diode 128, generally serve no purpose after the completion of burn-in testing. As a result, the pins 132A and 132B are wasted following burn-in testing.

Embodiments of the invention are directed to providing a direct temperature measurement of a semiconductor device while avoiding significant problems of the prior art, such as the appropriation of two pins for the sole purpose of temperature sensing during burn-in testing. In some embodiments, the temperature sensing circuit 112 senses, measures or estimates a die temperature of a semiconductor device 102 using a single I/O pin 136 of the device 102, as shown in FIG. 1. In some embodiments, the I/O pin 136 utilized in the temperature sensing technique may also be used for other I/O operations of the device 102. Accordingly, embodiments of the temperature sensing technique of the present invention avoids the package pins waste of prior art semiconductor devices 126 (FIG. 2), which allows for smaller and less costly semiconductor devices 102 having direct temperature measurement capability through a temperature output signal.

In some embodiments, the temperature sensing circuit 112 is configured to perform remote diode temperature sensing operations on a diode 140 of the semiconductor device or integrated circuit 102 that is not a dedicated temperature sense diode, such as diode 128 of the semiconductor device 126 (FIG. 2). Instead, the diode 140 is coupled to an I/O pin 136, which is also coupled to the core logic 124, as indicated in FIG. 1. In some embodiments, the diode 140 is an electrostatic discharge (ESD) protection diode, which is found in most conventional semiconductor devices 102.

Figure 3:
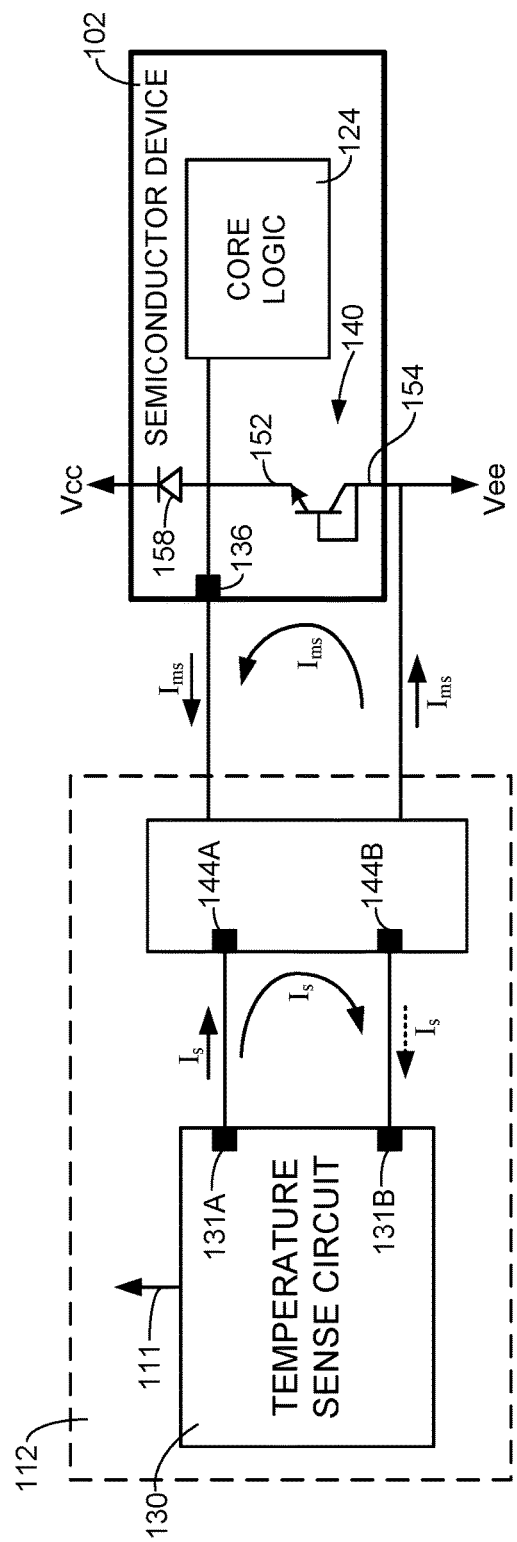
FIG. 3 is a simplified diagram of a remote diode temperature sensing circuit in accordance with embodiments of the invention electrically coupled to a semiconductor device.

FIG. 3 is a simplified diagram of the temperature sensing circuit 112, which is formed in accordance with embodiments of the invention, electrically coupled to a semiconductor device 102, and configured to perform a temperature sensing operation on the diode 140 during burn-in testing. The package pins 122 are not shown in order to simplify the drawing. The circuit 112 produces the temperature signal 111, which may be used by the temperature controller 110 to maintain the device 102 within a desired temperature range, as discussed above with reference to FIG. 1.

In some embodiments, the circuit 112 includes an industry standard remote temperature sense integrated circuit 130 and an adapter circuit 142. In some embodiments, the conventional remote diode temperature sense circuit 130 operates as described above with regard to FIG. 2 by producing the temperature sense currents $I_s$ at pins 131A and 131B, and measuring the voltage difference between the pins 131A and 131B. Based on the voltage measurements, the circuit 130 produces the temperature signal 111, which, as described above, may be used by the temperature controller 110 of the burn-in system 100 to control the temperature of the device 102.

Embodiments of the remote diode temperature sensing circuit 112 include a single integrated circuit that combines the circuitry of the remote diode temperature sense circuit 130 and the adapter circuit 142 formed in accordance with one or more embodiments described herein. In some embodiments, the remote diode temperature sense circuit 130 is an integrated circuit, and the adapter circuit 142 is a separate integrated circuit whose pins 144A and 144B are electrically coupled or coupleable to the pins 131A and 131B of the circuit 130.

In some embodiments, the adapter circuit 142 generally translates the temperature sense routine performed by the circuit 130 such that it can be applied to the ESD diode 140 of the semiconductor device 102, as illustrated in FIG. 3. That is, the adapter circuit 142 generates mirror sense currents $I_{ms}$ that mirror the sense currents $I_s$ produced by the circuit 130, and delivers the mirrored sense currents $I_{ms}$ through the diode 140. The sense currents $I_s$ are not merely routed through the diode 140, but are generated by the adapter circuit 142. In some embodiments, the mirrored sense currents $I_{ms}$ have substantially the same amplitude of the sense currents $I_s$, but are at the opposite polarity, as indicated in FIG. 3. In some embodiments, the voltage difference generated between the pins 131A and 131B is translated into a different voltage across the diode 140 by the adapter circuit 142.

The adapter circuit 142 also measures the voltage difference across the diode 140 during the delivery of the mirrored sense currents $I_{ms}$ through the diode 140, and forces the measured voltage difference to the pins 131A and 131B of the circuit 130. In some embodiments, the adapter circuit 142 also forces the sense currents $I_s$ back to the circuit 130 through the pin 131B. The circuit 130 operates in a conventional manner by producing the output signal 111 based on the measured voltages, which is indicative of the temperature of the diode 140.

In summary, the adapter circuit 142 translates the sense currents $I_s$ produced by the circuit 130 in a manner that allows them to be delivered through the diode 140 through the I/O pin 136 as the mirrored sense currents $I_{ms}$, and then forces the voltages measured across the diode 140 in response to the application of the mirrored sense currents $I_{ms}$ to the pins 131A and 131B of the conventional circuit 130. The circuit 130 then produces the temperature signal 111, which is indicative of the temperature of the diode 140 and the die of the semiconductor device 102, that may be used by the burn-in system 100 as describe above. Thus, the adapter circuit 142 allows the conventional remote diode temperature sensing circuit 130 to be used to sense or determine the temperature of a non-dedicated temperature sense diode 140 through an I/O pin 136.

Figure 4:
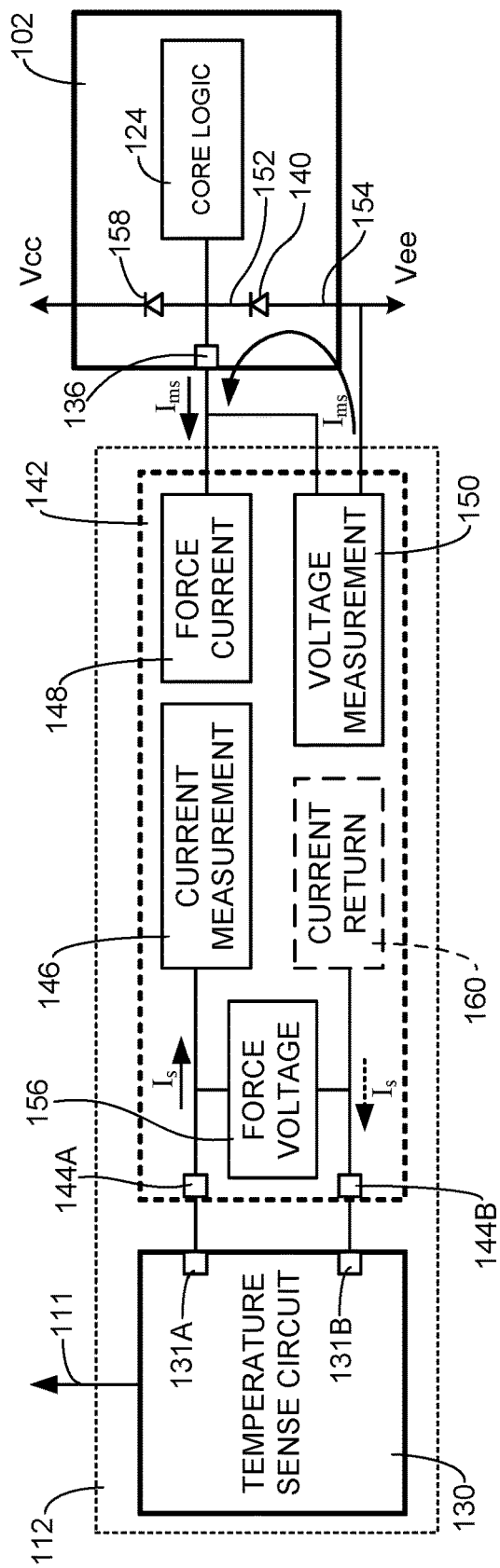
FIG. 4 is a simplified diagram of a remote diode temperature sensing circuit in accordance with embodiments of the invention electrically coupled to a semiconductor device.

FIG. 4 is a simplified diagram of the temperature sensing circuit 112 in accordance with exemplary embodiments of the invention electrically coupled to a semiconductor device 102. In some embodiments, the adapter circuit 142 includes inputs or pins 144A and 144B that are respectively coupled to the pins 131A and 131B of the temperature sense circuit 130. The temperature sense currents $I_s$ produced by the circuit 130 are received at the pin 144A. In some embodiments, the adapter circuit 142 includes a current measurement block 146, which is configured to measure each of the currents $I_s$. As used herein, the term "block" means a circuit portion that is generally configured to carry out a given function, but may also include a software component.

In some embodiments, the circuit 142 includes a force current block 148, which is configured to drive mirrored sense currents $I_{ms}$ based on the current measurements made by the current measurement block 146. In some embodiments, the mirrored sense currents $I_{ms}$ are equal to the sense currents $I_s$, or are substantially equal to the sense currents $I_s$ (e.g., within 10% of the corresponding sense currents $I_s$).

In some embodiments, the circuit 142 includes a voltage measurement block 150 that is configured to measure a voltage difference between the cathode 152 and the anode 154 of the diode 140. In the exemplary embodiment of FIG. 4, the voltage measurement block 150 measures the voltage difference between the pin 136 and the supply voltage Vee.

In some embodiments, the adapter circuit 142 includes a forced voltage block 156, which is configured to force the voltage measured by the voltage measurement block 150 across the pins 131A and 131B. The circuit 130 uses the forced voltage applied to the pins 131A and 131B by the block 156 to produce the temperature signal 111 in accordance with the conventional temperature sensing routine performed by the circuit 130 that is indicative of the temperature of the diode 140 and the die of the semiconductor device 102.

As mentioned above, in some embodiments, the diode 140 is configured for electrostatic discharge for the I/O pin 136 of the semiconductor device 102. In some embodiments, the cathode 152 of the diode 140 is electrically coupled to the I/O pin 136, and the anode 154 is coupled to the negative supply voltage Vee, as shown in the exemplary semiconductor device 102 of FIG. 4. As a result, in some embodiments, the force current block 148 forward biases the diode 140 to drive the mirrored sense currents $I_{ms}$ through the diode 140. It is understood that the ESD diode 140 of FIG. 4 is one exemplary diode of the semiconductor device 102 that may be used to measure or estimate the temperature of the die of the semiconductor device 102. The adapter circuit 142 may also be configured to drive the mirrored sense currents $I_{ms}$ through another diode of the semiconductor device 102, such as diode 158, in which the anode is electrically coupled to the I/O pin 136 and the cathode is electrically coupled to the positive supply voltage Vcc, as shown in FIG. 4.

In some embodiments, the adapter circuit 142 includes a current return block 160 that is configured to deliver currents that match the sense currents $I_s$ measured by the current measurement block 146 to the circuit 130 through the pin 131B, as indicated in FIG. 4. The returned sense current $I_s$ may be used to satisfy conventional remote diode temperature sense integrated circuits 130 that perform "Beta Correction" for compensation of non-ideal leaky diodes. In general, real world implications of dedicated integrated diodes 128 for sensing the temperature of the semiconductor device 126 are actually PNP transistors, as shown in FIG. 2. The emitter 162 and base 164 of such transistors 128 are connected to the temperature sense circuit 130 through the dedicated pins 132A and 132B. The collector 166 is generally coupled to the substrate of the negative supply voltage (Vee), as shown in FIG. 2. In performing Beta Correction, the temperature sense circuit 130 measures the emitter and base currents in order to calculate the collector current. This technique is described in U.S. Pat. No. 7,461,974. The returned current produced by the current return block 160 satisfies this need to receive a current that represents the current from the base 164 of the dedicated temperature sense diode 128. If such Beta Correction is not required by the temperature sense circuit 130, then the current return block 160 may be omitted and it is unnecessary to return any current to the pin 131B of the temperature sense circuit 130.

Figure 5:
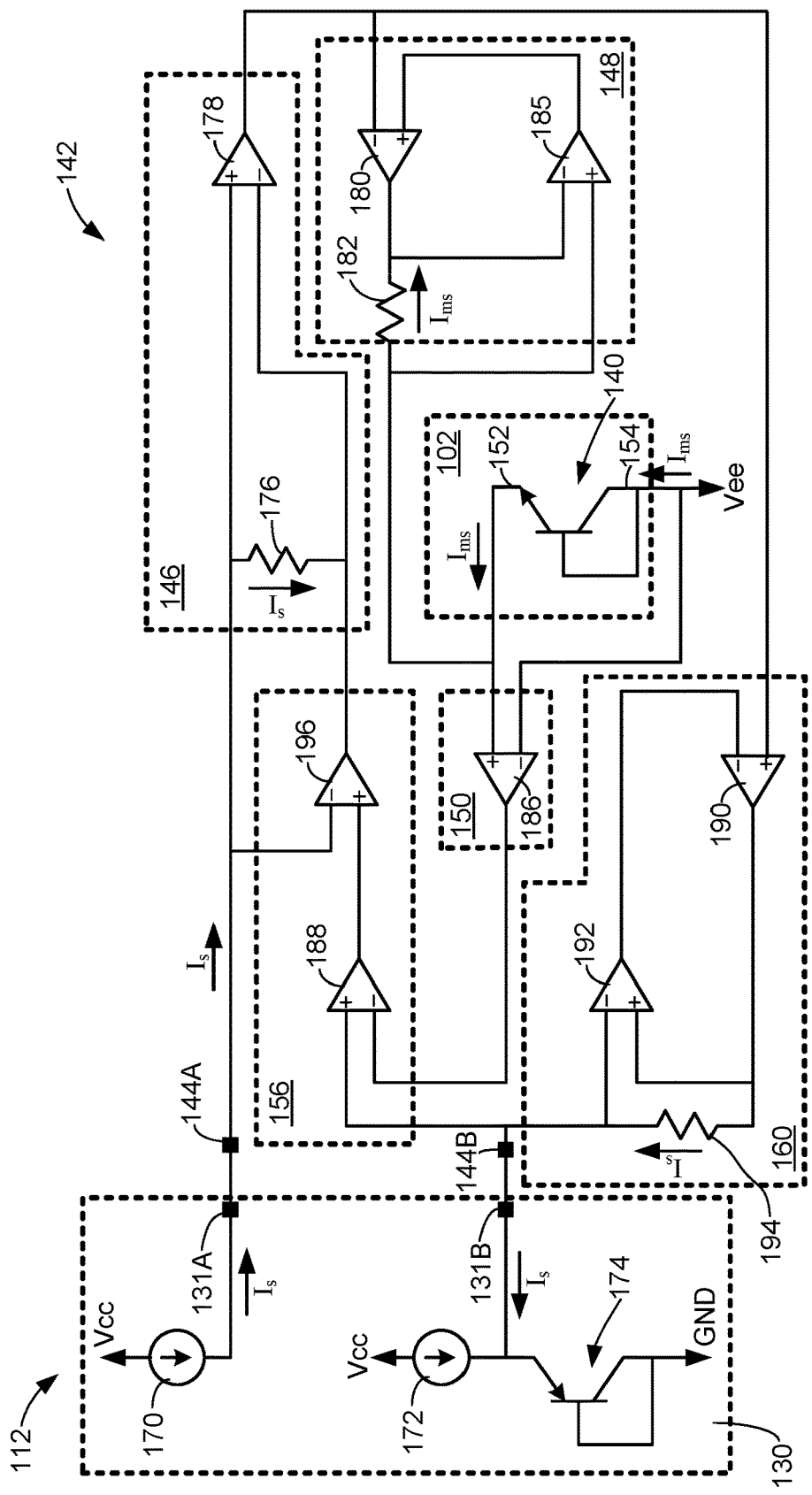
FIG. 5 is an op-amp block diagram illustrating an exemplary remote diode temperature sensing circuit in accordance with embodiments of the invention electrically coupled to a semiconductor device.

FIG. 5 is an op-amp block diagram illustrating an exemplary adapter circuit 142, in accordance with embodiments of the invention. As shown in FIG. 5, the remote diode temperature sense circuit 130 includes current sources 170 and 172, which are respectively coupled to the pins 131A and 131B. The current source 172 may be coupled to Vee and a PNP transistor 174. It should be understood that this is a simplified representation of a conventional remote diode temperature sense circuit 130, and that the circuit 130 may take on other conventional forms while providing the desired function described herein.

The temperature sense currents $I_s$ are delivered to the line or pin 144A of the adapter circuit 142 through the pin 131A. This current travels through the resistor 176. The voltage drop across the resistor 176 is input to the difference voltage amp 178 of the current measurement block 146. The output from the amp 178 is provided to the op-amp 180 of the force current block 148, which drives the mirrored sense current $I_{ms}$ through resistor 182 and the diode 140 (represented by an NPN transistor) of the semiconductor device 102 under test. The voltage drop across the resistor 182 is fed to a voltage difference amp 185, the output of which is fed to the op-amp 180. The voltage difference between the cathode 152 and the anode 154 of the diode 140 is output from a difference voltage amp 186 of the voltage measurement block 150 to the difference voltage amp 188 of the forced voltage block 156.

In some embodiments, the output from the difference voltage amp 178 is provided to the op-amp 190 of the return current block 160, which, using the output of a difference voltage amp 192, drives the return sense currents $I_s$ through a resistor 194 as well as into the pin 131B, which may be necessary when the temperature sense circuit 130 performs Beta Correction, as discussed above.

The pin voltage at 131B and output of the difference amp 186 are delivered to difference amp 188, which outputs the force voltage level desired at the pin 131A. An op-amp 196 of the force voltage block 156 receives, as inputs, the output from the difference voltage amp 188 and the voltage at the pin 131A. The output from the op-amp 196 is coupled to the current measurement block 146 to effectively force the same difference voltage across the pins 131A and 131B, as measured by the difference amp 186 across the diode 140.

Figure 6:
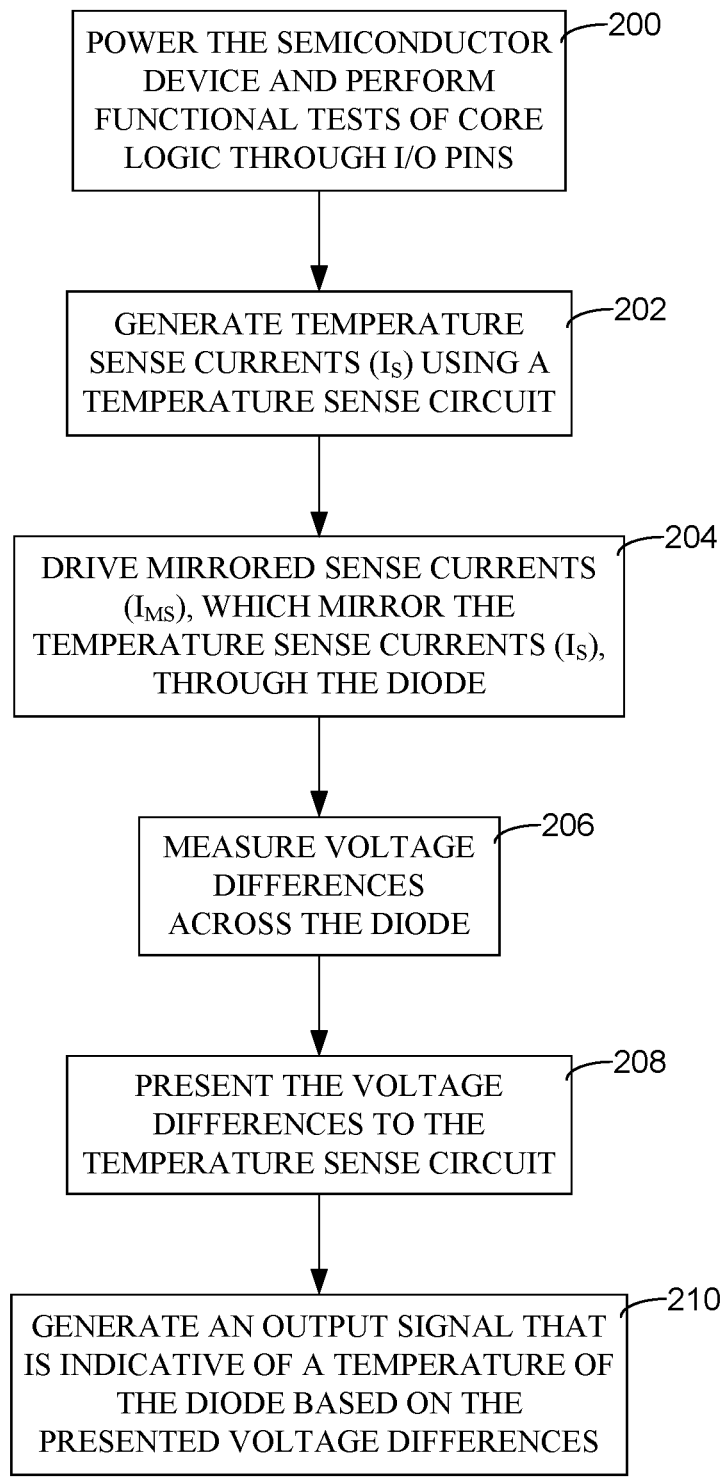
FIG. 6 is a flowchart illustrating a method of sensing, measuring, or estimating a temperature of a diode of a semiconductor device during burn-in testing, in accordance with embodiments of the invention.

FIG. 6 is a flowchart illustrating a method of sensing, measuring, or estimating a temperature of a diode 140 and the die of a semiconductor device 102 during burn-in testing, in accordance with embodiments of the invention. At 200, power is applied to the semiconductor device 102 and functional tests of the core logic 124 are performed through I/O pins 122 (FIG. 1). At 202, a temperature sense circuit 130 generates temperature sense currents $I_s$, as illustrated in FIGS. 3 and 4. In some embodiments, the temperature sense currents $I_s$ are delivered to the input 144A of the adapter circuit 142.

In some embodiments, the adapter circuit 142 measures the sense currents $I_s$ using the current measurement block 146. At 204, mirrored sense currents $I_{ms}$, which mirror the sense currents $I_s$ or the measured sense currents $I_s$, are driven through the I/O pin 136 and the diode 140 using the force current block 148, as shown in FIG. 4.

At 206, the voltage differences that are produced across the diode 140 in response to the driving of the mirrored sense currents $I_{ms}$ through the diode 140 in step 204 are measured using the voltage measurement block 150. At 208, the measured voltages are presented to the temperature sense circuit 130 using the force voltage block 156. In some embodiments, the measured voltages are forced onto the pins or inputs 131A and 131B of the circuit 130 through the pins 144A and 144B of the circuit 142 by the force voltage block 156.

At 210, an output signal 111, which is indicative of a temperature of the diode 140 and the die of the semiconductor device 102, is generated by the temperature sense circuit 130 based on the voltage differences presented to the circuit at step 208. The output signal 111 is generated by the temperature sense circuit 130 in accordance with a conventional temperature sense routine. In some embodiments, the system 100 adjusts the temperature of the semiconductor device 102 responsive to the output signal using, for example, the thermal head 106 (FIG. 1).

In summary, three or more different temperature sense currents $I_s$ are delivered to the diode 140 as mirrored sense currents $I_{ms}$, and the voltage differences across the diode 140 resulting from the application of the mirrored sense currents $I_{ms}$, which are forced to the lines 131A and 131B of the circuit 130, are used by the circuit 130 to sense, measure, or estimate the temperature of the diode 140. The circuit 130 outputs the temperature signal 111 indicating the temperature of the diode 140.

Although the present invention has been described with reference to preferred embodiments, workers skilled in the art will recognize that changes may be made in form and detail without departing from the spirit and scope of the invention.

What is claimed is:

1. A remote diode temperature sensing circuit for use in a burn-in system to sense a temperature of a semiconductor device under test having an integrated diode connected to an input/output (I/O) package pin that is integral to the semiconductor device, the circuit comprising:
   a temperature sense circuit that is external to the semiconductor device and is configured to output temperature sense currents ($I_s$) during a temperature sense routine;
   an adapter circuit that is external to the semiconductor device and is configured to drive mirrored sense currents ($I_{ms}$), which mirror the temperature sense currents, through the diode and present voltage differences across the diode responsive to the mirrored sense currents to the temperature sense circuit; and
   wherein the temperature sense circuit is configured to discharge a temperature output signal based on the voltage differences that is indicative of the temperature of the diode.

2. The remote diode temperature sensing circuit according to claim 1, wherein the adapter circuit comprises:
   a current measurement block configured to measure the temperature sense currents ($I_s$) output from the temperature sense circuit;
   a forced current block configured to drive the mirrored sense currents ($I_{ms}$) through the diode;
   a voltage measurement block configured to measure the voltage differences across the diode responsive to the driving of the mirrored sense currents through the diode; and
   the force voltage block is configured to present the measured voltage differences to the temperature sense circuit.

3. The remote diode temperature sensing circuit according to claim 2, wherein the adapter circuit comprises a current return block configured to drive the sense current ($I_s$) back to the temperature sense circuit.

4. The remote diode temperature sensing circuit according to claim 2, wherein the temperature sense circuit is configured to generate the temperature sense currents ($I_s$) during a temperature sense routine.

5. The remote diode temperature sensing circuit according to claim 1, wherein the I/O package pin is connected to core logic of the semiconductor device.

6. The remote diode temperature sensing circuit according to claim 1, wherein the diode is an electrostatic discharge (ESD) diode.

7. A burn-in system comprising the remote diode temperature sensing circuit according to claim 1.

8. An adapter circuit for use in a burn-in system for translating a temperature sense routine of a temperature sense circuit for application to a diode that is integral to a semiconductor device under test that is connected to an input/output (I/O) package pin that is integral to the semiconductor device, the adapter circuit being external to the semiconductor device and comprising:
- a current measurement block configured to measure temperature sense currents ($I_s$) output from the temperature sense circuit;
- a forced current block configured to drive mirrored sense currents ($I_{ms}$), which mirror the temperature sense currents, through the diode;
- a voltage measurement block configured to measure voltage differences across the diode during the driving of the mirrored sense currents through the diode; and
- a force voltage block configured to present the measured voltage differences to the temperature sense circuit.

9. The adapter circuit according to claim 8, further comprising a current return block configured to deliver currents that match sense currents ($I_s$) back to the temperature sense circuit.

10. The adapter circuit according to claim 8, wherein the I/O package pin is connected to core logic of the semiconductor device.

11. The adapter circuit according to claim 10, wherein the diode is an electrostatic discharge (ESD) diode.

12. A method of sensing a temperature of a diode that is integral to a semiconductor device during burn-in testing comprising:
- powering the semiconductor device and performing functional tests of core logic of the semiconductor device through I/O pins, which are integral to the semiconductor device;
- generating temperature sense currents ($I_s$) using a temperature sense circuit that is external to the semiconductor device;
- driving mirrored sense currents ($I_{ms}$), which mirror the temperature sense currents ($I_s$), through the diode;
- measuring voltage differences across the diode during driving the mirrored sense currents through the diode;
- presenting the voltage differences to the temperature sense circuit; and
- generating an output signal that is indicative of a temperature of the diode using the temperature sense circuit based on the presented voltage differences.

13. The method according to claim 12, wherein driving mirrored sense currents ($I_{ms}$) through the diode comprises driving the mirrored sense currents ($I_{ms}$) through an I/O pin of the semiconductor device.

14. The method according to claim 12, wherein the diode is an electrostatic discharge (ESD) diode.

15. The method according to claim 12, further comprising returning the sense current to the temperature sense circuit.

16. The method according to claim 12, further comprising adjusting a temperature of the semiconductor device responsive to the output signal.

* * * * *